(12) United States Patent
Lee et al.

(10) Patent No.: US 10,403,332 B2
(45) Date of Patent: Sep. 3, 2019

(54) MEMORY DEVICE AND MEMORY SYSTEM INCLUDING THE SAME

(71) Applicant: SAMSUNG ELECTRONICS CO., LTD., Suwon-si (KR)

(72) Inventors: Young Geun Lee, Seoul (KR); Young Jin Cho, Seoul (KR); Hee Hyun Nam, Seoul (KR); Hyo Deok Shin, Seoul (KR); Young Kwang Yoo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/792,973

(22) Filed: Oct. 25, 2017

(65) Prior Publication Data

US 2018/0122434 A1 May 3, 2018

(30) Foreign Application Priority Data

Nov. 2, 2016 (KR) .................... 10-2016-0145185

(51) Int. Cl.
| | |
|---|---|
| *G11C 7/10* | (2006.01) |
| *G06F 12/0879* | (2016.01) |
| *G06F 13/16* | (2006.01) |
| *G11C 8/06* | (2006.01) |
| *G11C 5/04* | (2006.01) |
| *G11C 8/12* | (2006.01) |

(52) U.S. Cl.
CPC ........ *G11C 7/1057* (2013.01); *G06F 12/0879* (2013.01); *G06F 13/1673* (2013.01); *G11C 5/04* (2013.01); *G11C 7/106* (2013.01); *G11C 7/1066* (2013.01); *G11C 8/06* (2013.01); *G11C 8/12* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 8,977,806 B1 | 3/2015 | Rosenband et al. | |
| 9,043,513 B2 | 5/2015 | Perego | |
| 9,158,684 B2 | 10/2015 | Lee et al. | |
| 9,348,705 B1 | 5/2016 | Wu et al. | |
| 2009/0019184 A1* | 1/2009 | Skerlj | G06F 13/1684 710/5 |

(Continued)

*Primary Examiner* — Douglas King
(74) *Attorney, Agent, or Firm* — Sughrue Mion, PLLC

(57) ABSTRACT

Provided are a memory device and a memory system including the same. The memory device may include a first memory rank including at least one first memory chip, a memory controller configured to provide a command to the first memory rank, at least one data buffer configured to buffer data input to the at least one first memory chip or being output from the at least one first memory chip, and a second memory rank connected to the first memory rank and comprising at least one second memory chip. The first memory rank may provide training data and a data strobe signal to the second memory rank based on a data training command from the memory controller without the training data and the data strobe signal passing through the data buffer. The second memory rank may determine a delay of the data strobe signal based on the training data being detected by the second memory rank.

14 Claims, 12 Drawing Sheets

(56) References Cited

U.S. PATENT DOCUMENTS

| | | | |
|---|---|---|---|
| 2010/0315891 A1* | 12/2010 | Welker | G06F 13/1689 |
| | | | 365/193 |
| 2014/0237176 A1 | 8/2014 | Takefman et al. | |
| 2014/0281161 A1 | 9/2014 | Chen et al. | |
| 2015/0378841 A1 | 12/2015 | Jayakumar et al. | |
| 2016/0011802 A1 | 1/2016 | Berke | |
| 2016/0071552 A1* | 3/2016 | Ohwada | H02J 9/061 |
| | | | 365/185.08 |
| 2016/0314822 A1* | 10/2016 | Yeung | G06F 13/16 |
| 2018/0089079 A1* | 3/2018 | Hansson | G06F 12/0623 |

\* cited by examiner

MEMORY DEVICE AND MEMORY SYSTEM INCLUDING THE SAME

This application claims priority from Korean Patent Application No. 10-2016-0145185, filed on Nov. 2, 2016 in the Korean Intellectual Property Office, the disclosure of which is incorporated herein by reference in its entirety.

BACKGROUND

1. Field

The present disclosure relates to a memory device and a memory system including the same.

2. Description of the Related Art

Semiconductor memory devices are generally classified into volatile memory devices such as a dynamic random access memory (DRAM) and a static random access memory (SRAM), and nonvolatile memory devices such as an electrically erasable programmable read-only memory (EEPROM), a ferroelectric RAM (FRAM), a phrase-change RAM (PRAM), a magnetoresistive RAM (MRAM), a resistive RAM (RRAM), and a flash memory.

A volatile memory, especially a DRAM, is widely used as a main memory of a system since it has a fast response speed. On the other hand, a nonvolatile memory, especially a flash memory, is capable of storing a relatively large volume of data and is widely used as one of auxiliary memories of a system since it has semi-permanent data storage capability.

There has been proposed a non-volatile dual in-line memory module (NVDIMM) that purports to offer the best of both worlds of the volatile memories and the non-volatile memories. Thus, NVDIMMs are used in systems that require fast response speed achieved by the volatile memories and the semi-permanent data storage capability achieved by the nonvolatile memories.

SUMMARY

One or more exemplary embodiments provide a memory system, especially a memory device using a NVDIMM. In such a memory system, it may be sometimes necessary to transfer data as a memory rank (i.e., a set of memories which can be selected and controlled by one chip select signal).

Aspects of the present disclosure provide a training method for determining a delay between memory ranks, and a memory device for reliably performing transfer between memory ranks based on the determined delay.

Aspects of the present disclosure also provide a memory system including a memory device for performing delay training between memory ranks and data transfer between the memory ranks based on the delay training.

This and other aspects, embodiments and advantages of the present disclosure will become immediately apparent to those of ordinary skill in the art upon review of the Detailed Description and Claims to follow.

In accordance with an aspect of an exemplary embodiment, a memory device includes a first memory rank including at least one first memory chip, a memory controller configured to provide a command to the first memory rank, at least one data buffer configured to buffer first data being at least one of input to and output from the at least one first memory chip, and a second memory rank connected to the first memory rank and including at least one second memory chip. The first memory rank provides training data and a data strobe signal to the second memory rank based on a data training command from the memory controller without the training data and the data strobe signal passing through the data buffer. The second memory rank determines a delay of the data strobe signal based on the training data being sensed by the second memory rank.

In accordance with an aspect of an exemplary embodiment, a memory system includes a system controller, and a memory device controlled by the system controller. The memory device includes a first memory rank including at least one volatile memory chip, at least one data buffer configured to buffer data input/output to/from each of the at least one volatile memory chip, and a second memory rank including at least one non-volatile memory chip. The memory device, upon receiving an event signal from the system controller, performs training between the first memory rank and the second memory rank without the training data passing through the data buffer, to determine a delay of a strobe signal.

DETAILED DESCRIPTION OF THE EMBODIMENTS

Figure 1:
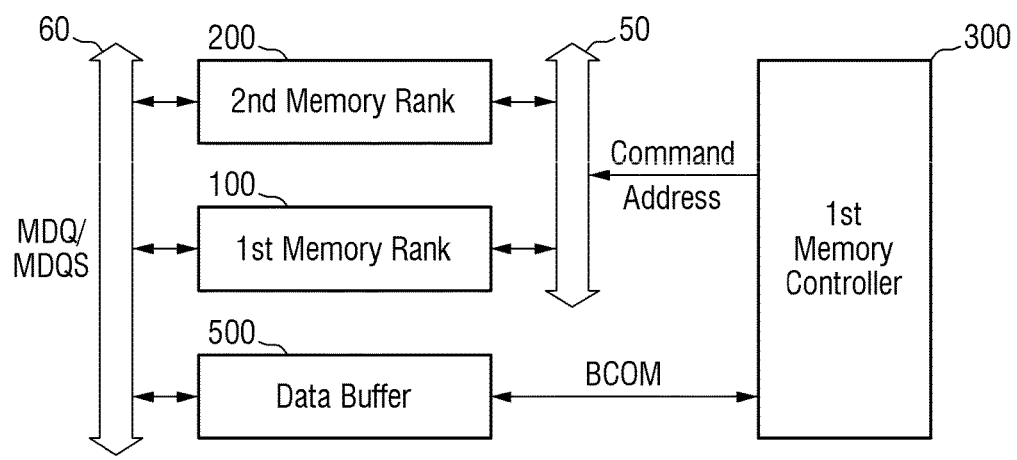
FIG. 1 is a block diagram of a memory device according to an exemplary embodiment.

FIG. 1 is a block diagram of a memory device according to an exemplary embodiment.

In FIG. 1, a memory device 10 according to an exemplary embodiment may include a first memory rank 100, a second memory rank 200, a memory controller 300, and a data buffer 500. Herein, each element may be configured as a separate chip, module or apparatus, or may be included in one device, but the present disclosure is not limited thereto.

The first memory rank 100 may include a plurality of memory chips. The plurality of memory chips included in the first memory rank 100 may be connected by a single chip select signal Chip Select. That is, a memory controller receiving a request for access from a central processing unit (CPU) provides a chip select signal to the memory device 10, and a plurality of memory chips included in one memory rank can be accessed simultaneously.

The first memory rank 100 may receive a command and an address for data access from the memory controller 300 and may receive/transmit data read from or to be written to a given area via the second data bus 60.

The second memory rank 200 may also include a plurality of memory chips. The second memory rank 200 may be connected to the first memory rank 100 and the memory controller 500. That is, when the memory controller 300 attempts to access the second memory rank 200, the memory controller 300 provides an access command and a target address to the second memory rank 200.

The second memory rank 200 may receive a command and an address for data access from the first memory rank 100 and may receive/transmit data read from or to be written to a given area via the second data bus 60.

The memory controller 300 may be connected to the first memory rank 100 and the second memory rank 200 via a first data bus 50.

In the memory device 10 according to the exemplary embodiment of the present disclosure, the memory controller 300 may be, but is not limited to, a register clock driver (RCD). Alternatively, the memory controller 300 may be a memory controller that includes separate logic for accessing the first memory rank 100 and the second memory rank 200.

If the memory controller 300 is an RCD, the memory controller 300 may be connected to a system controller (e.g., host controller) connected to the memory device 10 and may receive a command and an address for accessing the memory chips included the first memory rank 100 or the second memory rank 200 from the system controller.

When the address received from a system controller corresponds to an address for accessing data of a memory chip included in the first memory rank 100, the memory controller 300 may provide a command and an address to the first memory rank 100. On the other hand, when the address received from the system controller corresponds to an address for accessing data of a memory chip included in the second memory rank 200, the memory controller 300 may provide a command and the address to the second memory rank 200.

As shown in FIG. 1, the memory controller 300, the first memory rank 100 and the second memory rank 200 may be connected to one another via the first data bus 50. The memory controller 300 may provide commands and addresses for accessing the first memory rank 100 or the second memory rank 200 via the first data bus 50. In particular, in the memory device 10 according to the exemplary embodiment of the present disclosure, training commands for direct data transfer between the first memory rank 100 and the second memory rank 200 may be concatenated via the first data bus 50.

The first memory rank 100, the second memory rank 200 and the data buffer 500 may be connected to one another via a second data bus 60. The data read from or to be written to the first memory rank 100 or the second memory rank 200 may be transferred via the second data bus 60. In particular, data MDQ and data strobe MDQS signals for direct data transfer between the first memory rank 100 and the second memory rank 200 may be transmitted via the second data bus 60. Accordingly, the first memory rank 100, the second memory rank 200 and the data buffer 500 may share the second data bus 60.

The second data bus 60 may include a number of channels for transmitting data of multiple bits on the rising or falling edge of a clock. In addition, the second data bus 60 may be connected to each of the plurality of memory chips in the first memory rank 100 and the second memory rank 200. If the number of the semiconductor chips included in the data buffer 500 is equal to the number of memory chips in the first memory rank 100, the second data bus 60 may be configured to connect the plurality of semiconductor chips in the first memory rank 100 with those in the data buffer 500, respectively.

The data buffer 500 may be connected to the first memory rank 100 and the second memory rank 200 via the second data bus 60. The data buffer 500 may connect the memory ranks to an external device outside the memory device 10 when the first memory rank 100 or the second memory rank 200 included in the memory device 10 communicates with the external device. Accordingly, the data buffer 500 may store temporarily the data (e.g., first data) read from or to be written to the first memory rank 100 or the second memory rank 200.

The data buffer 500 may include, for example, first in, first out (FIFO) logic. In addition, the data buffer 500 may be configured as, but is not limited to, a plurality of semiconductor chips. The data buffer 500 may also be configured as a single semiconductor chip.

The data buffer 500 may be operated by receiving a control signal BCOM from the memory controller 300.

The first memory rank 100, the second memory rank 200 and the data buffer 500 will be described in more detail with reference to FIG. 2.

Figure 2:
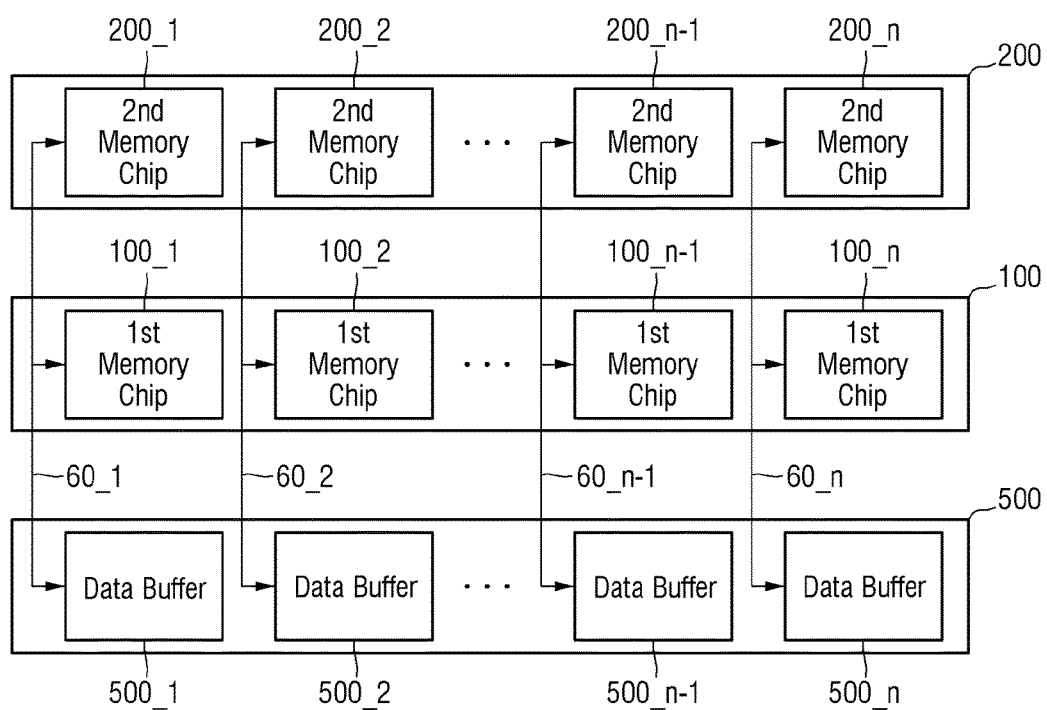
FIG. 2 is a block diagram of a part of a memory device according to an exemplary embodiment.

FIG. 2 is a block diagram of a part of a memory device according to an exemplary embodiment.

As shown in FIG. 2, the first memory rank 100 may include a plurality of memory chips 100_1 to 100_$n$, and the second memory rank 200 may include a plurality of memory chips 200_1 to 200_$n$, respectively.

In some embodiments, the first memory chips 100_1 to 100_$n$ and the second memory chips 200_1 to 200_$n$ may include different types of memory chips. More specifically, the first memory chips 100_1 to 100_$n$ may include volatile memory chips, while the second memory chips 200_1 to 200_$n$ may include non-volatile memory chips.

When the first memory chips 100_1 to 100_$n$ include volatile memory chips, the first memory chips 100_1 to 100_$n$ may include, for example, double data rate (DDR) synchronous dynamic random-access memories (SDRAMs). When the second memory chips 200_1 to 200_$n$ include non-volatile memory chips, the second memory chips 200_1 to 200_$n$ may include, but is not limited to, a flash memory, a magnetoresistive random access memory (MRAM), a ferroelectric random access memory (FRAM), etc.

Although the first memory chips 100_1 to 100_$n$ and the second memory chips 200_1 to 200_$n$ include different types of memory chips in the foregoing description, the present disclosure is not limited thereto. That is, the first memory chips 100_1 to 100_$n$ and the second memory chips 200_1 to 200_$n$ may include the same type of memory chips. Specifically, both of the first memory chips 100_1 to 100_$n$ and the second memory chips 200_1 to 200_$n$ may include DDR SDRAMs.

In operation of the memory device 10, data transfer between the first memory rank 100 and the second memory rank 200 may be required. At this time, the first memory rank 100 and the second memory rank 200 transmit data via a second memory controller.

In this regard, the transmission rate of the data signal MDQ may differ in each of the plurality of channels included in a first line 60_1 or a second line 60_2 depending on the length of a line pattern on the substrate. The data signal MDQ provided from the first memory rank 100 is sensed (e.g., detect) by the second memory rank 200 by the toggle of the data strobe signal MDQS. Since the transmission rates of the data signal MDQ differ from channel to channel, the reliability of the transfer of the data signal may be affected.

Therefore, in order to ensure the reliability of transmission of the different data signals MDQ for different channels, it is necessary to adjust the delay of the toggle timing of the data strobe signal MDQS, and accordingly the training of the data strobe signal MDQS may be performed to select an appropriate amount of delay. The training of the data strobe signal MDQS will be described in more detail below.

The second data bus 60 shared by the first memory rank 600, the second memory rank 200 and the data buffer 500 may have bi-directional transmission characteristics. That is, when data is read from the first memory rank 100 by the memory controller 300, the data read from the first memory rank 100 is transferred to the second memory rank 200 or the data buffer 500 simultaneously.

The data buffer 500 may temporarily store the data transmitted from the first memory rank 100 or may transmit the data to an external device when the memory controller 300 issues the control command BCOM. In addition, a second memory controller may provide the data transferred from the first memory rank 100 to the second memory rank 300 when the memory controller 300 issues a data reception command (e.g., a sniffing command).

Figure 3:
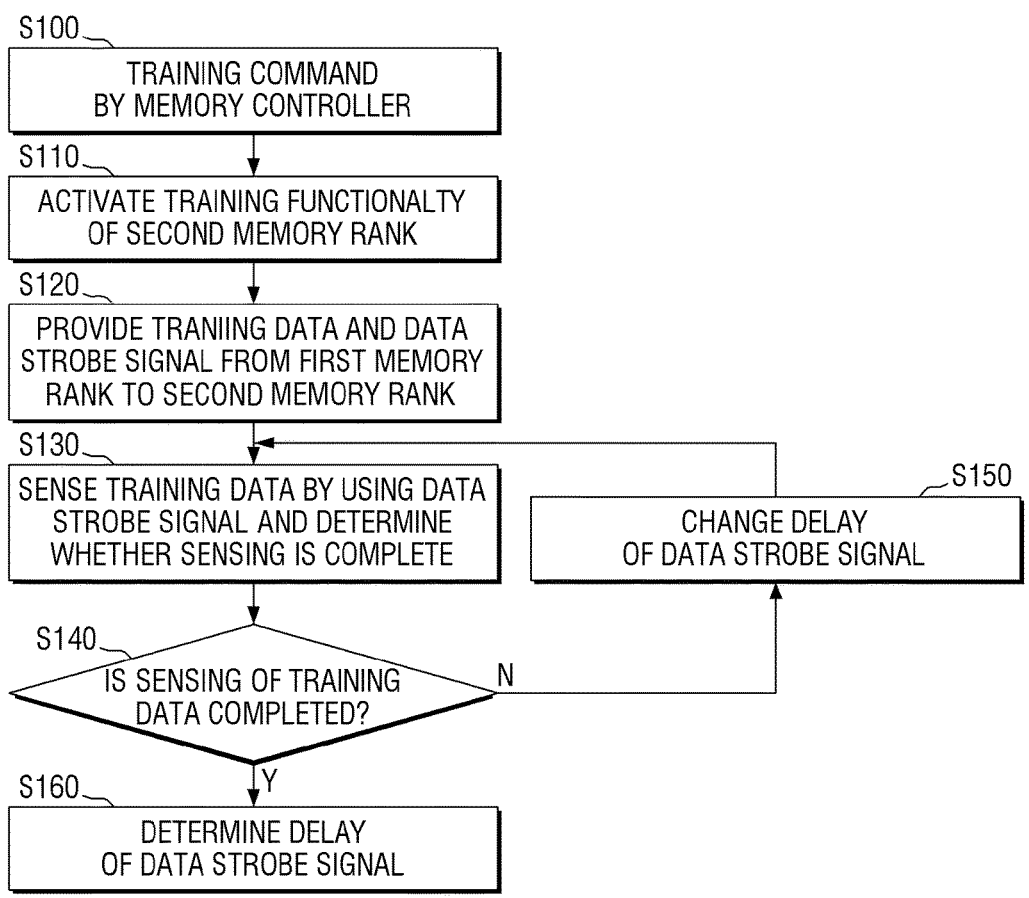
FIG. 3 is a flowchart for a method of training between memory ranks included in a memory device according to an exemplary embodiment.

FIG. 3 is a flowchart for a method of training between memory ranks included in a memory device according to an exemplary embodiment.

As shown in FIG. 3, the training between the memory ranks included in the memory device may start with providing a training command by the memory controller 300 (S100), followed by activating the training functionality of the second memory rank (S110). Subsequently, training data and a data strobe signal may be provided to the second memory rank 200 from the first memory rank 100 (S120), and the second memory rank 200 uses the data strobe signal to sense (e.g., detect) the training data to then determine whether the sensing is completed (S130). If it is determined that the sensing of the training data is not completed, the delay of the data strobe signal may be adjusted (S150) and the sensing is tried again. If it is determined that the sensing of the training data is completed, the delay of the data strobe signal used for the data sensing is determined (S160).

The memory controller 300 provides a data training command via the first data bus 50, and the data training command is transferred to the second memory rank 200. The second memory rank 200 activates the data training functionality pursuant to the data training command. As will be described below, when the data training functionality is activated, the second memory rank 200 adjusts the delay of the data strobe signal MDQS provided from the first memory rank 100, and checks if the training data MDQ provided from the first memory rank 100 is sensed.

Subsequently, the memory controller 100 provides a read command of the training data MDQ and the data strobe signal MDQS to the first memory rank 100 via the first data bus 50, and the first memory rank 100 provides the training data MDQ and the data strobe signal DQS to the second memory rank 200 via the second data bus 60.

When the first memory rank 100 provides the training data MDQ and the data strobe signal MDQS via the second data bus 60, these signals may also be transferred to the data buffer 500 sharing the second data bus 60. However, since the memory controller 300 does not provide the control signal BCOM to the data buffer 500, the data buffer 500 does not receive the training data MDQ and the data strobe signal MDQS. That is, during the process of determining the delay in the memory device 10 according to the embodiment of the present disclosure, the data buffer 500 is not involved.

As described above, the command used when the memory controller 300 provides the data training command to the second memory rank 200 may be different from the command used when the memory controller 300 provides the read command of the training data and the data strobe signal to the first memory rank 100. However, the present disclosure is not limited thereto. That is, the memory controller 300 may provide the data training command simultaneously to the first memory bank 100 and the second memory bank 200 via the first data bus 50, such that the first memory rank 100 may provide the training data and the data strobe signal and the second memory rank 200 may activate the data training functionality.

At this time, since the lengths of the channels included in the second data bus 60 connecting the first memory rank 100 to the second memory rank 200 may be different from one another as mentioned earlier, the training data MDQ may arrive at different times. The delay of the training data will be described with reference to the timing diagrams.

Figure 4:
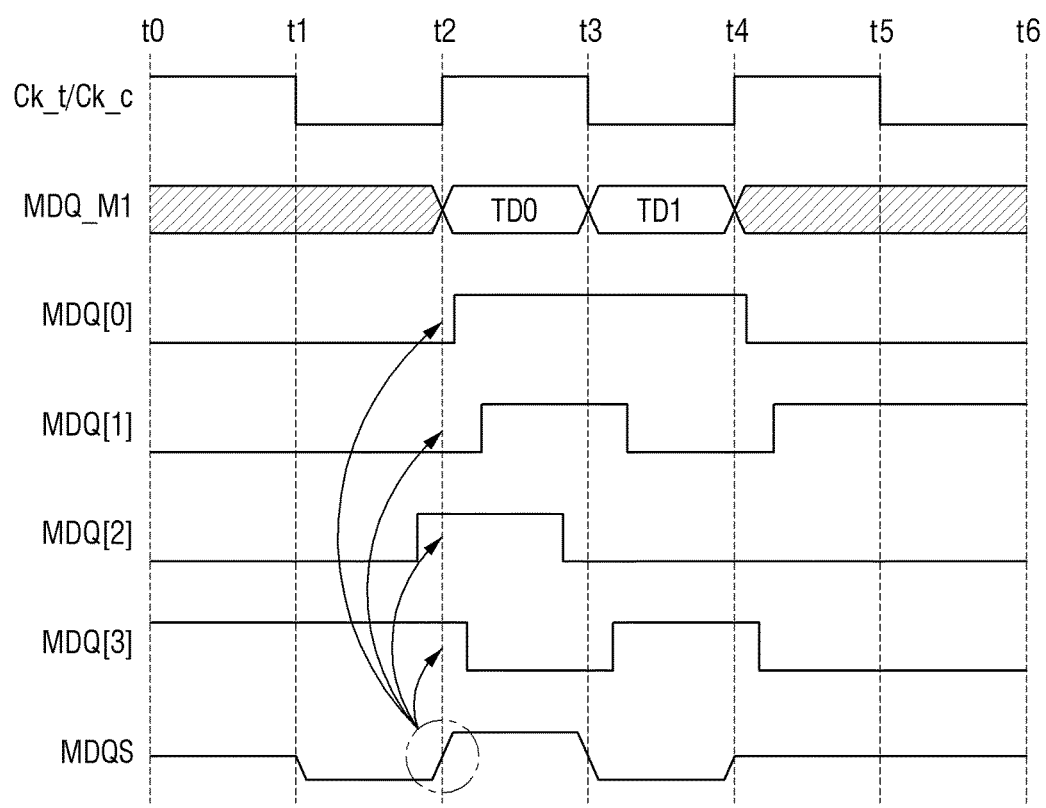
FIGS. 4 to 5B are timing diagrams illustrating a method of training between memory ranks included in a memory device according to an exemplary embodiment.
Figure 5A:
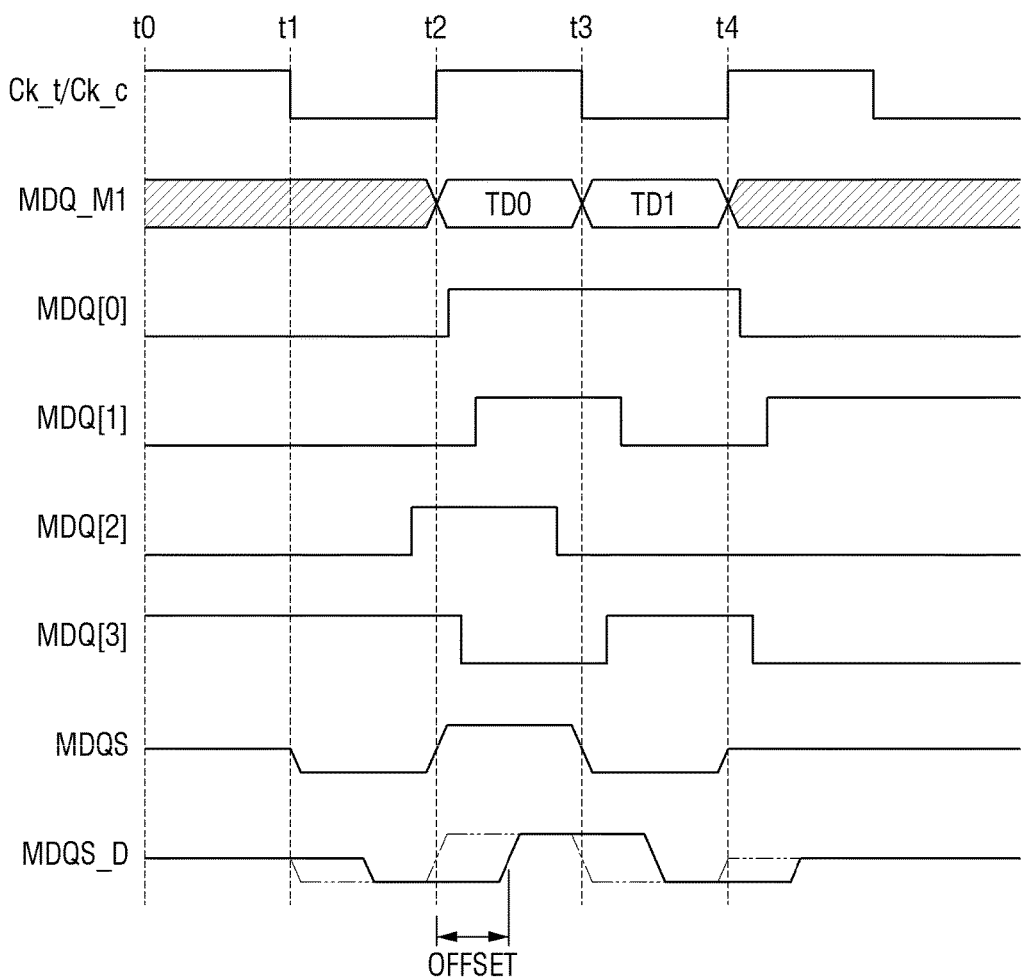
Figure 5B:
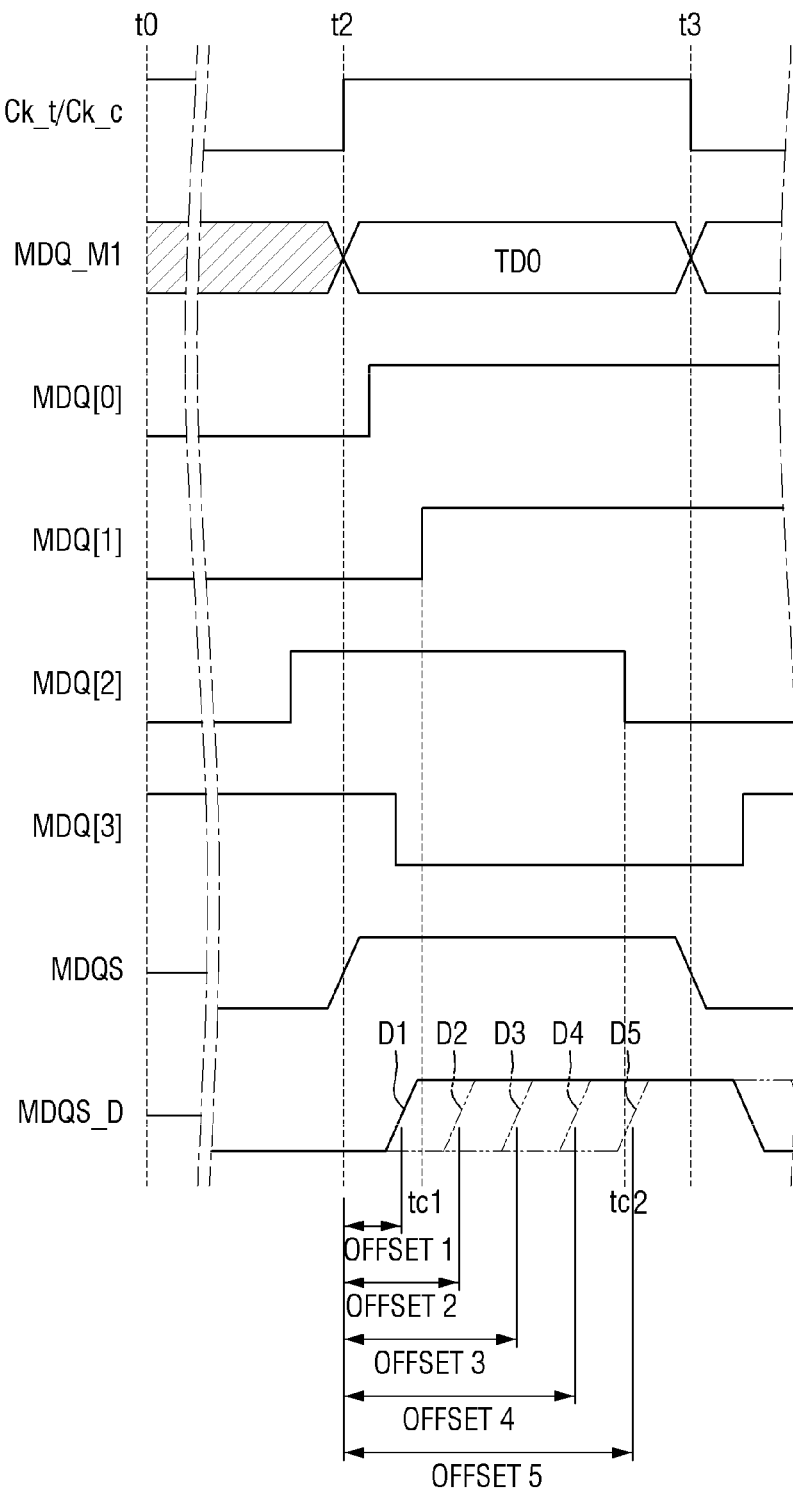

FIGS. 4 to 5B are timing diagrams illustrating a method of training between memory ranks included in a memory device according to an exemplary embodiment.

In FIG. 4, at time t2, training data MDQ is provided. In the diagrams, the waveform of the training data MDQ provided from the first memory rank 100 is represented as MDQ_M1, and the training data transmitted to the second memory rank 200 via the second data bus 60 is represented as MDQ [3:0]. Herein, the training data provided from the first memory rank 100 is described as being a 4-bit signal, but the present disclosure is not limited thereto. It is to be understood that the width of the second data bus 60 responsible for the data transfer between the first memory rank 100 and the second memory rank 200 may vary depending on the design of the memory device 10.

In the example shown in FIG. 4, training data TD0 is transferred on the rising edge of a clock Clk at time t2, and training data TD1 is transferred on the falling edge of the clock Clk at time t3. The waveforms of other signals required for data transfer between the first memory rank 100 and the second memory rank 200 are not shown. The data transfer may be performed in a double data rate (DDR) scheme in which data transfer is distinguished by rising and falling edges of clocks, or may be performed in a single data rate (SDR) scheme in which data transfer is initiated on either a rising or falling edge of a clock.

The training data TD0 may include, for example, data of '0111' and the training data TD1 may include data of '1001.' When the training data MDQ is sensed (e.g., detect) according to the toggle of the data strobe signal MDQS at times t2 and t3, the sensed training data may be '1100' and '0011' instead due to the differences in delay times caused by the different paths of the second data bus 60 between the first memory rank 100 and the second memory rank 200, which are different from the data TD0 and TD1 transferred from the first rank 100. That is, in this example, MDQ[2] first reaches the second memory rank 200, and MDQ[0] reaches the second memory rank 200 last.

Accordingly, in order to ensure the reliability of the data transfer between the first memory rank 100 and the second memory rank 200, it is necessary to adjust the delay time of the data strobe signal MDQS used for sensing (e.g., detecting) the training data MDQ so that the sensing timing of the training data TD0 and TD1 is adjusted.

In FIGS. 5A and 5B, the second memory rank 200 generates a delayed data strobe signal MDQS_D by adjusting a delay offset OFFSET of the data strobe signal MDQS, and attempts to sense (e.g., detect) the training data TD0 and TD1 by using the delayed data strobe signal MDQS_D.

More specifically, the second memory rank 200 may adjust the delay offset OFFSET of the data strobe signal MDQS to generate first to fifth delayed strobe signals D1 to D5.

The first delayed data strobe signal MDQS_D1 is a signal delayed by a first delay offset OFFSET1 from the received data strobe signal MDQS. However, even though the first delayed data strobe signal MDQS_D1 is delayed by the first delay offset OFFSET1, it is toggled earlier than time point tc1, at which the delayed MDQ[1] arrives, and accordingly the sensing (e.g., detecting) of the training data using the first delayed data strobe signal MDQS_D1 fails.

In this regard, the determining whether or not the sensing of the training data is completed may be carried out by comparing the transferred training data MDQ with reference data. That is, the second memory rank 200 may set the reference data prior to transmitting the training data and then may compare the reference data with the training data (MDQ) transmitted in the training process.

In some embodiments of the present disclosure, a method of training between memory ranks may include performing training by adjusting delays of data MDQ instead of adjusting the delay of the data strobe signal MDQS.

In some embodiments of the present disclosure, the reference data may be, but is not limited to, data that is preloaded in the second memory rank 200. That is, the reference data may be provided to the second memory rank 200 when a data training command by the first controller 300 is provided.

If it is determined that the reference data does not coincide with the transferred training data MDQ as a result of the comparison by the second memory rank 200, it may be determined that the transmission of the training data MDQ has failed. When this happens, it means that the sensing (e.g., detecting) of the training data MDQ with the delayed data strobe signal MDQS_D has failed, and accordingly the second memory rank 200 provides a sensing failure signal to the memory controller 300 and increments a delay offset value to a second delay offset OFFSET2.

When the memory controller 300 receives the sensing failure signal, it may instruct the first memory rank 100 to provide the training data MDQ again. The first memory rank 100 provides the training data MDQ and the data strobe signal MDQS to the second memory rank 200, as described above.

The second memory rank 200 attempts to sense (e.g., detect) the training data MDQ using the incremented second delay offset OFFSET2. As shown in FIG. 5B, a second delayed data strobe signal MDQS_D2 delayed by using the second delay offset OFFSET2 is toggled later than time point tc1 at which the MDQ[1] arrives last at the second memory rank 200. Accordingly, the sensing of the training data with the second delayed data strobe signal MDQS_D2 generates the results of '0111' and '1001,' which coincide with the training data TD0 and TD1 transmitted by the first memory rank 100, respectively.

If it is determined that the reference data coincides with the transferred training data MDQ as a result of the comparison by the second memory rank 200, it may be determined that the transmission of the training data MDQ has succeeded.

When the second memory rank 200 has succeeded in sensing (e.g., detecting) the training data MDQ, the delay offset value OFFSET2 at this time point may be determined as the delay value of the data strobe signal MDQS.

However, the present disclosure is not limited thereto. For example, the second memory rank 200 may not end the training process even if the sensing of the training data MDQ has succeeded. That is, the second memory rank 200 may keep receiving the training data MDQ by incrementing the delay offset value, and then may determine a previous delay offset value OFFSET4 of the delay offset value OFFSET5, which fails to sense the training data MDQ for the first time as the delay value of the data strobe signal MDQS.

Alternatively, an average of two delay offset values OFFSET2 and OFFSET4 at the critical points where the sensing of the training data MDQ has succeeded may be calculated and determined as the delay value of the data strobe signal MDQS.

When the sensing of the training data has been completed as described above, the second memory rank 200 may transmit a sensing completion signal to the memory controller 300 and determine a training delay value. The determined training delay value may be stored in the second memory rank 200.

Figure 6A:
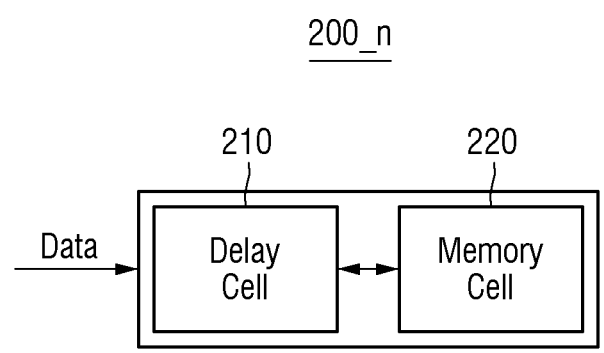
FIGS. 6A and 6B are block diagrams illustrating a part of a memory device according to an exemplary embodiment.
Figure 6B:
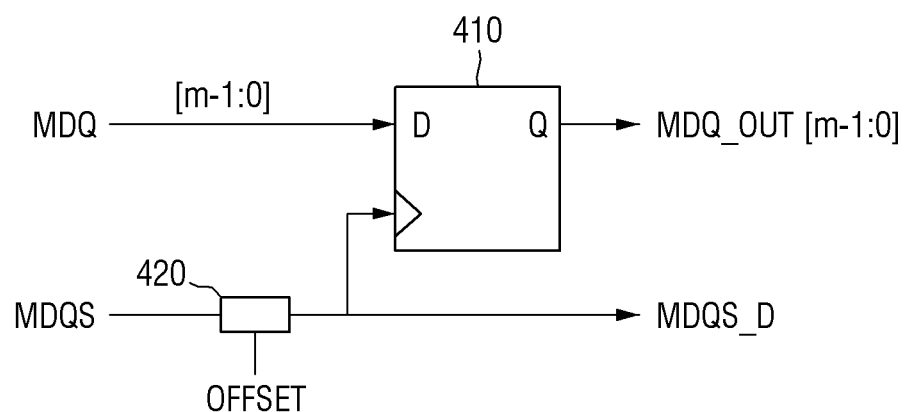

FIGS. 6A and 6B are block diagrams illustrating a part of a memory device according to an exemplary embodiment.

As shown in FIG. 6A, a memory chip 200_n included in the second memory rank 200 according to an exemplary embodiment may include a delay cell 210 and a memory cell 220. The delay cell 210 may include circuitry to adjust the delay of the data strobe signal MDQS provided from the first memory rank 100, and the memory cell 220 may store the data MDQ.

In FIG. 6B, an exemplary circuitry that may be included in the delay cell 210 is shown. The delay cell 210 may include a sensing circuit 410 for sensing (e.g., detecting) the data MDQ and a delay adder 420. That is, the delay offset OFFSET is applied to the received data strobe signal MDQS to generate a delayed data strobe signal MDQS_D, which is used by the sensing circuit 410 to sense the data MDQ transmitted from the first memory rank 100. Although the sensing circuit 410 is shown as a kind of flip-flop in FIG. 6B, this is merely illustrative. The sensing circuit 410 may include other types of circuit elements for sensing data transmitted from the first memory rank 100.

Although the operation of determining the delay of the training data MDQ by the memory device 10 has been described with reference to FIGS. 5A and 5B, the present disclosure is not limited thereto. That is, the second memory rank 200 may decrement the delay offset OFFSET to determine the delay of the training data MDQ. That is, when the training data MDQ is transferred initially, the delay adder 420 may attempt to sense the training data MDQ with a predetermined delay value, and may attempt to sense the training data MDQ by decrementing the delay offset OFFSET to determine the delay value with which the sensing of the training data MDQ succeeds.

In the foregoing description, the delay of the training data MDQ is determined when the sensing of the training data MDQ succeeds for all the channels of the training data MDQ, but the present disclosure is not limited thereto. In some embodiments of the present disclosure, a different delay of the training data MDQ may be set for each of the channels of the second data bus 60. That is, for data bits included in the training data MDQ, it is determined whether the sensing of the training data MDQ has succeeded or not by varying the delay offset OFFSET, and then different delays of the training data MDQ may be determined for different channels.

In summary, the process of determining, by the second memory rank 200, the delay necessary for the sensing of the data MDQ provided by the first memory rank 100 for data transfer between the first memory rank 100 and the second memory rank 200 has been described above. During the process of determining the delay, only the first memory rank 100, the memory controller 300 and the second memory rank 200 included in the first memory device 10 may be involved. The data buffer 500 is not involved in the process of determining the delay because data is directly transferred between the second memory rank 200 and the first memory rank 100, as described below.

Figure 7:
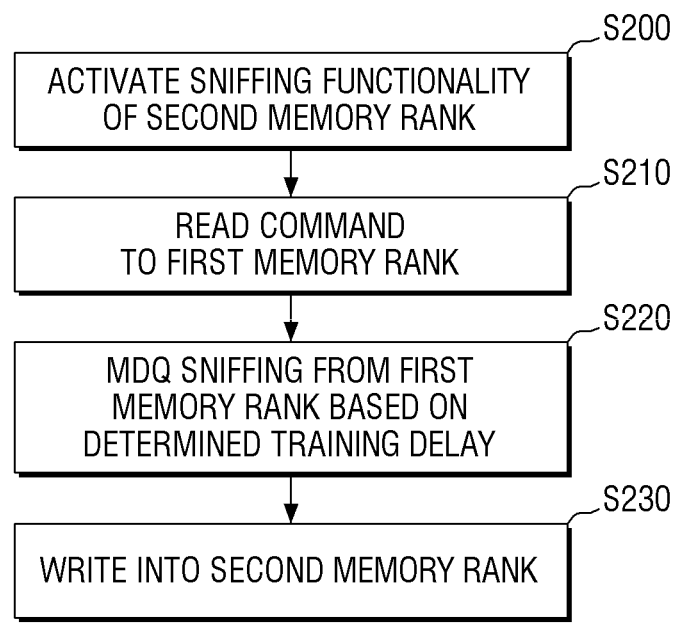
FIG. 7 is a flowchart for a method of transferring data between memory ranks in a memory device according to an exemplary embodiment.

FIG. 7 is a flowchart for a method of transferring data between memory ranks in a memory device according to an exemplary embodiment.

In FIG. 7, data transfer between the first memory rank 100 and the second memory rank 200 in the memory device 10 according to an aspect of an exemplary embodiment starts with activating sniffing functionality of the second memory rank 200 by the memory controller 300 (S200). When the sniffing functionality of the second memory rank 200 is activated, the second memory rank 200 may then sense the data from the first memory rank 100 transmitted via the second data bus 60.

Subsequently, the memory controller 300 provides a read command and an access address to the first memory rank 100 via the first data bus 50 (S210). The access address provided by the memory controller 300 may designate the first memory rank 100 as a whole, but the present disclosure is not limited thereto. That is, the access address provided by the memory controller 300 may correspond to some of the plurality of first memory chips 100_1 to 100_n included in the first memory rank 100 or may correspond to some area of a first memory chip (e.g., the first memory chip 100_1).

The first memory rank 100 having received the read command and the access address transmits the data MDQ and the data strobe signal MDQS via the second data bus 60.

The data provided by the first memory rank 100 may be transferred toward the data buffer 500 sharing the second data bus 60 with the second memory rank 200. However, since the memory controller 300 does not provide the control signal BCOM to the data buffer 500 as in the above-described process of determining the delay, the data buffer 500 may not receive the data provided by the first memory rank 100. That is, in the process of transferring data (e.g., second data) between the first memory rank 100 and the second memory rank 200, the data buffer 500 need not be involved.

When the data MDQ and the data strobe signal MDQS provided by the first memory rank 100 are transferred to the second memory rank 200, the second memory rank 200 sniffs the data MDQ based on the delay previously determined in the training process (S220). The sniffing the data MDQ by the second memory rank 200 may include delaying the data strobe signal MDQS using the training delay determined previously and sensing the data MDQ using the delayed data strobe signal MDQS_D.

When the sniffing of the data MDQ has been completed, the second memory rank 200 writes the received data into the second memory chip 200_n (S230).

In this manner, the data transfer between the first memory rank 100 and the second memory rank 200 by the memory device 10 according to an aspect of an exemplary embodiment may be performed by using the previously determined training delay, without the data transfer passing through the data buffer 500. As the data transfer between the memory ranks 100 and 200 does not pass through the data buffer 500, the data can be transferred faster.

Figure 8A:
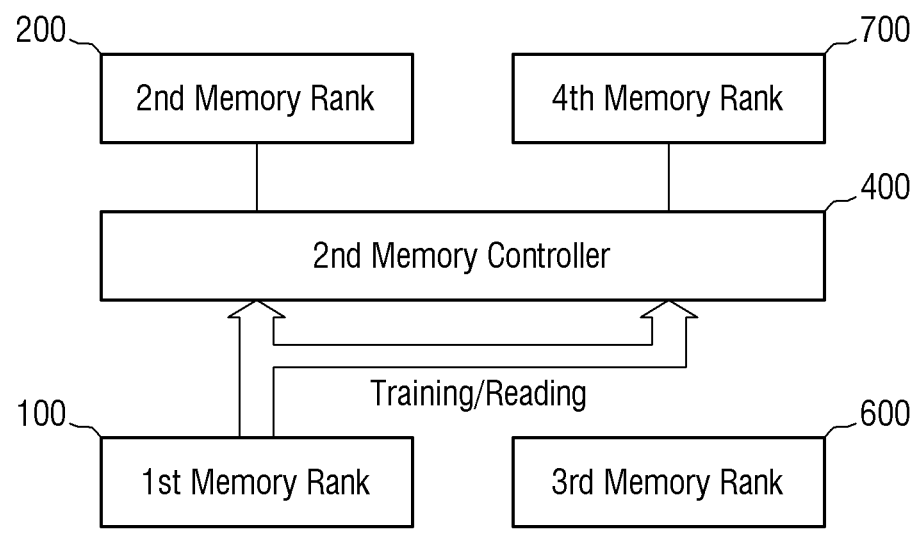
FIGS. 8A and 8B are block diagrams for illustrating training and data transfer between memory ranks in a memory device according to an exemplary embodiment.
Figure 8B:
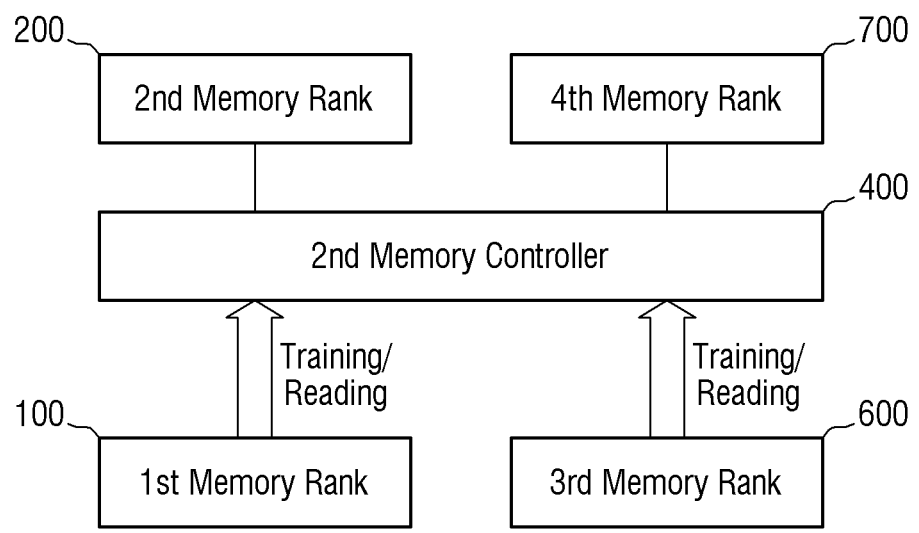

FIGS. 8A and 8B are block diagrams for illustrating training and data transfer between memory ranks of a memory device according to an exemplary embodiment.

As shown in FIGS. 8A and 8B, a memory device 20 according to an aspect of an exemplary embodiment may further include a third memory rank 600 and a fourth memory rank 700.

Each of the third memory rank 600 and the fourth memory rank 700 may include one or more memory chips selected by the same chip select signal.

According to an aspect of an exemplary embodiment, the third memory rank 600 may include different types of memories from the fourth memory rank 700. That is, the third memory rank 600 may include volatile memories, and the fourth memory rank 700 may include non-volatile memories, but the present disclosure is not limited thereto. That is, both of the third memory rank 600 and the fourth memory rank 700 may be volatile memories.

Each of the third memory rank 600 and the fourth memory rank 700 may be interconnected with the first memory rank 100 and the second memory rank 200.

The first memory rank 100 may transfer the same data to the second memory rank 200 and the fourth memory rank 700. The first to fourth memory ranks 100, 200, 600, and 700 may share the same data bus to simultaneously transfer the same data from one memory rank to a plurality of memory ranks. For example, when data is transferred from the first memory rank 100 to the second memory rank 200 and the fourth memory rank 700, a process of determining the delay for the training data provided by the first memory rank 100 may be performed on a plurality of channels to which the second memory rank 200 and the fourth memory rank 700 are connected. In addition, the delay thus determined may also be used for the delay of the data strobe signal when data is transferred from the first memory rank 100 to the second and fourth memory ranks 200 and 700.

On the other hand, as shown in FIG. 8B, data may be transferred from the first and third memory ranks 100 and 600 to the second and fourth memory ranks 200 and 700, respectively. In this case, the delay training and the data transfer from the first memory rank 100 to the second memory rank 200 and the delay training and the data transfer from the third memory rank 600 to the fourth memory rank 700 may be performed simultaneously.

That is, even if the memory device 10 includes one or more pairs of memory ranks, the delay training and the data transfer between the memory ranks may be performed simultaneously for the pairs of memory ranks.

Figure 9:
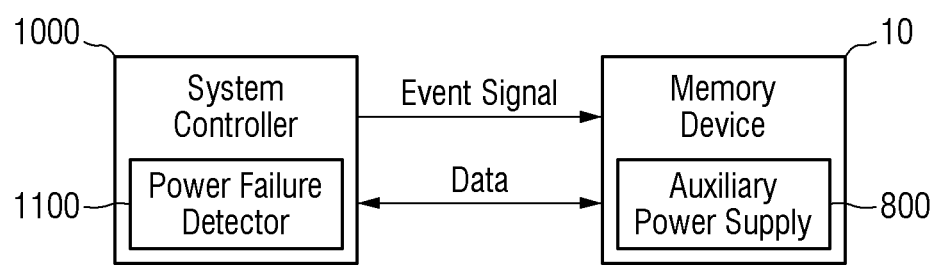
FIG. 9 is a block diagram illustrating a memory system according to an exemplary embodiment of the present disclosure.

FIG. 9 is a block diagram illustrating a memory system according to an exemplary embodiment of the present disclosure.

Referring to FIG. 9, a memory system 30 according to an exemplary embodiment may include a memory device 10 and a system controller 1000.

The system controller 1000 may control the memory device 10. The system controller 1000 may provide commands and addresses to the memory device 10 and transfer data pursuant to access commands to data in the memory device 10 from a host device such as a central processing unit (CPU).

The system controller 1000 may provide an event signal to the memory device 10. The memory device 10 may receive the event signal and may perform the delay training between the memory ranks described above.

According to an aspect of an exemplary embodiment, the event signal may be a system boot signal. That is, at the time of initial system boot, the system controller 1000 may provide the system boot signal to the memory device 10, and the memory device 10 may store the delay determined by performing the delay training between the memory ranks.

Alternatively, the event signal may be a power failure signal. That is, the system controller 1000 may include a power failure detector 1100 to thereby detect whether the power supplied to the system has been interrupted. When the power failure detector 1100 detects a power failure, the system controller 1000 may provide a power failure signal to the memory device 10.

According to an aspect of an embodiment, the memory device 10 may include an auxiliary power supply 800 and may perform the delay training and the data transfer between the memory ranks when the power failure occurs. The auxiliary power supply 800 may include, for example, a super capacitor, but the present disclosure is not limited thereto.

The memory device 10 may supply the power supplied from the auxiliary power supply 800 to the first and second memory ranks 100 and 200 (see FIG. 1). While the power is supplied from the auxiliary power supply 800, data backup may be performed from a memory rank including volatile memory chips in the memory device 10 to a memory rank including non-volatile memory chips.

Various exemplary embodiments have been described with reference to the attached drawings, but it may be understood by one of ordinary skill in the art that the present disclosure may be performed one of ordinary skill in the art in other specific forms without changing the technical concept or essential features of the present disclosure. Further, the above-described embodiments are merely examples and do not limit the scope of the rights of the present disclosure.

What is claimed is:

1. A memory device comprising:
a first memory rank comprising at least one first memory chip;
a memory controller configured to provide a command to the first memory rank;
at least one data buffer configured to buffer first data being at least one of input to and output from the at least one first memory chip;
a second memory rank connected to the first memory rank and comprising at least one second memory chip;
a first data bus, through which the memory controller, the first memory rank, and the second memory rank are connected; and
a second data bus, through which the first memory rank, the second memory rank, and the at least one data buffer are connected,
wherein the first memory rank is configured to provide training data and a data strobe signal to the second memory rank via the second data bus, based on a data training command from the memory controller, without the training data and the data strobe signal passing through the at least one data buffer, and
wherein the second memory rank is configured to determine a delay of the data strobe signal based on the training data being detected by the second memory rank.

2. The memory device according to claim 1, wherein the at least one first memory chip and the at least one second memory chip are of different types from each other.

3. The memory device according to claim 2, wherein the at least one first memory chip is a volatile memory chip, and the at least one second memory chip is a non-volatile memory chip.

4. The memory device according to claim 2, wherein the memory controller is further configured to provide a read command to the first memory rank,
wherein the first memory rank is further configured to provide second data stored in the first memory rank to the second memory rank based on the read command, and
wherein the second memory rank is further configured to detect and store the second data provided from the first memory rank by using the data strobe signal with the delay applied.

5. The memory device according to claim 4, wherein the second data stored in the first memory rank is provided to the second memory rank without passing through the at least one data buffer.

6. The memory device according to claim 1, wherein the memory controller provides the data training command to the first memory rank via the first data bus.

7. The memory device according to claim 1, wherein the second data bus comprises a plurality of channels, and
wherein the delay is determined for each of the plurality of channels.

8. The memory device according to claim 1, wherein the determining the delay of the data strobe signal by the second memory rank comprises one of:
incrementing the delay of the data strobe signal to determine whether the training data has been detected, and
decrementing the delay of the data strobe signal to determine whether the training data has been detected.

9. The memory device according to claim 8, wherein the second memory rank is further configured to determine whether the training data is detected by comparing predetermined reference data with the training data that is received.

10. A memory system comprising:
a system controller; and
a memory device controlled by the system controller, the memory device comprising:
a first memory rank comprising at least one volatile memory chip,
at least one data buffer configured to buffer data being at least one of input to and output from each of the at least one volatile memory chip,
a second memory rank comprising at least one non-volatile memory chip,
a first data bus, through which the system controller, the first memory rank, and the second memory rank are connected, and
a second data bus, through which the first memory rank, the second memory rank, and the at least one data buffer are connected,
wherein the memory device is configured to, upon receiving an event signal from the system controller, perform training between the first memory rank and the second memory rank via the second data bus, without training data passing through the at least one data buffer, to determine a delay of a strobe signal.

11. The memory system according to claim 10, wherein the event signal is a system boot signal.

12. The memory system according to claim 10, wherein the event signal is a power failure signal.

13. The memory system according to claim 12, wherein the memory device further comprises an auxiliary power supply, and
  wherein the memory device, upon receiving the power failure signal, provides power supplied from the auxiliary power supply to the first memory rank and the second memory rank.

14. The memory system according to claim 10, wherein the first memory rank is configured to transfer data to the second memory rank using the delay that is determined, without the data passing through the at least one data buffer.

* * * * *